United States Patent
Mizobe et al.

(10) Patent No.: US 9,647,301 B2
(45) Date of Patent: May 9, 2017

(54) BATTERY MONITORING APPARATUS (71) Applicant: DENSO CORPORATION, Kariya, Aichi-pref. (JP)

(72) Inventors: Shunichi Mizobe, Kariya (JP); Tsuneo Maebara, Nagoya (JP); Masaya Itou, Toyota (JP)

(73) Assignee: DENSO CORPORATION, Kariya (JP)

( * ) Notice: Subject to any disclaimer, the term of this patent is extended or adjusted under 35 U.S.C. 154(b) by 588 days.

(21) Appl. No.: 14/092,441

(22) Filed: Nov. 27, 2013

(65) Prior Publication Data
US 2014/0147713 A1 May 29, 2014

(30) Foreign Application Priority Data
Nov. 28, 2012 (JP) ................................ 2012-259813

(51) Int. Cl.
*H01M 10/48* (2006.01)
*G01R 31/36* (2006.01)

(52) U.S. Cl.
CPC ........ *H01M 10/482* (2013.01); *G01R 31/362* (2013.01); *G01R 31/3658* (2013.01)

(58) Field of Classification Search
CPC .................................................. H01M 10/482
See application file for complete search history.

(56) References Cited

U.S. PATENT DOCUMENTS

| 2006/0026448 | A1  | 2/2006 | Horii |
| 2011/0006731 | A1* | 1/2011 | Wang ................ B60L 11/1816 320/109 |

FOREIGN PATENT DOCUMENTS

| JP | 2001-177998 | 6/2001 |
| JP | 2005-312276 | 11/2005 |
| JP | 2006-067776 | 3/2006 |
| JP | 2007-141572 | 6/2007 |
| JP | 2010-226811 | 10/2010 |

OTHER PUBLICATIONS

Office Action (2 pages) dated Oct. 7, 2014, issued in corresponding Japanese Application No. 2012-259813 and English translation (3 pages).

* cited by examiner

*Primary Examiner* — Jane Rhee
(74) *Attorney, Agent, or Firm* — Nixon & Vanderhye P.C.

(57) ABSTRACT

A battery monitoring apparatus monitors a battery pack configured by a plurality of battery cells. The battery monitoring apparatus includes a main monitoring unit, a sub monitoring unit and a control unit. The main monitoring unit monitors a plurality of physical quantities indicating a battery state of the battery pack. The sub monitoring unit monitors a part of the physical quantities separately from the main monitoring unit. The control unit detects malfunction of the battery pack on the basis of at least one of a monitoring result of the main monitoring unit and a monitoring result of the sub monitoring unit.

10 Claims, 3 Drawing Sheets

FIG.1

BATTERY MONITORING APPARATUS

CROSS-REFERENCE TO RELATED APPLICATION

This application is based on and claims the benefit of priority from Japanese Patent Application No. 2012-259813 filed on Nov. 28, 2012, the disclosure of which is incorporated in its entirety by reference.

BACKGROUND

Technical Field

The present invention relates to a battery monitoring apparatus that monitors a state of a battery pack configured by a plurality of battery cells.

Related Art

A battery monitoring apparatus in related art includes a monitoring means that monitors a state of a battery pack, and a control means that controls the monitoring means and detects malfunction of the battery pack by acquiring the results of the monitoring performed by the monitoring means, as disclosed in, for example, patent document JP-A-2010-226811.

JP-A-2010-226811 discloses a battery monitoring apparatus that includes means for monitoring voltage conditions of a battery pack. This monitoring means is configured by a plurality of overcharge/overdischarge detection sections and a flying-capacitor type voltage detection section. The overcharge/overdischarge detection sections are provided to respective battery blocks which are groups of battery cells each including a predetermined number of battery cells.

According to JP-A-2010-226811, the means for monitoring voltage conditions of the battery pack has a redundant configuration. Accordingly, in the event that either of the detection sections has a fault, the other of the detection sections can continue monitoring voltage conditions of the battery pack.

Recently, from the standpoint of ensuring functional safety, a battery monitoring apparatus is required to monitor various data (physical quantities) that indicate the state of the battery pack. Also, from the same standpoint, such a battery monitoring apparatus is required to include a monitoring means having a redundant configuration in order to ensure reliability in the results of the monitoring.

However, if the monitoring means for monitoring various data that indicate the state of the battery pack is entirely redundantly configured, the number of components of the monitoring means in the battery monitoring apparatus will be doubled. This raises a problem that the internal configuration of the battery monitoring apparatus will be complicated.

SUMMARY

It is thus desired to provide a battery monitoring apparatus which is able to enhance reliability, while minimizing complication in the internal configuration, the complication being attributed to the redundancy of means for monitoring a battery pack.

The present disclosure is targeted to a battery monitoring apparatus which is applied to a battery pack configured by a plurality of battery cells.

According to one aspect of the present disclosure, there is provided a battery monitoring apparatus for monitoring a battery state of a battery pack configured by a plurality of battery cells. The battery monitoring apparatus includes: a main monitoring unit configured to monitor a plurality of physical quantities indicating the battery state of the battery pack; a sub monitoring unit configured to monitor a part of the physical quantities separately from the main monitoring unit; and a control unit configured to detect malfunction of the battery pack on the basis of at least one of a monitoring result of the main monitoring unit and a monitoring result of the sub monitoring unit.

Thus, when a part of the physical quantities among the physical quantities indicating the state of the battery pack is ensured to be monitored by both of the main monitoring unit and the sub monitoring unit, in the event that one of the monitoring means develops a fault, the other one of the monitoring means can continuously monitor the battery pack.

Since a part of the plurality of physical quantities that are monitored by the main monitoring unit is ensured to be monitored by the sub monitoring unit, the battery monitoring apparatus can be realized with a simplified configuration, compared to the case where the sub monitoring unit and the main monitoring unit are similarly configured.

Thus, the battery monitoring apparatus of the present disclosure can enhance reliability, while being prevented from having a more complicated internal configuration, which would be attributed to the redundancy of the means for monitoring the state of the battery pack.

In the battery monitoring apparatus, the sub monitoring unit may be configured to be smaller in the number of the physical quantities monitored as the part of the physical quantities than the main monitoring unit.

This configuration can contribute to simplifying the configuration for monitoring the part of the physical quantities in the sub monitoring unit. Thus, the battery monitoring apparatus can be realized with a more simplified configuration.

In the battery monitoring apparatus, the sub monitoring unit may be configured to be lower in detection performance of the part of the physical quantities than the main monitoring unit.

Thus, when the sub monitoring unit is ensured to be lower than the main monitoring unit in performance of detecting specified physical quantities, the sub monitoring unit can be realized with a simplified configuration compared to the main monitoring unit. Accordingly, the battery monitoring apparatus is well prevented from having complication in the internal configuration, which would be attributed to the redundancy in the configuration for detecting malfunction of the battery pack.

DESCRIPTION OF EMBODIMENTS

With reference to the accompanying drawings, hereinafter is described an embodiment of the present invention.

Figure 1:
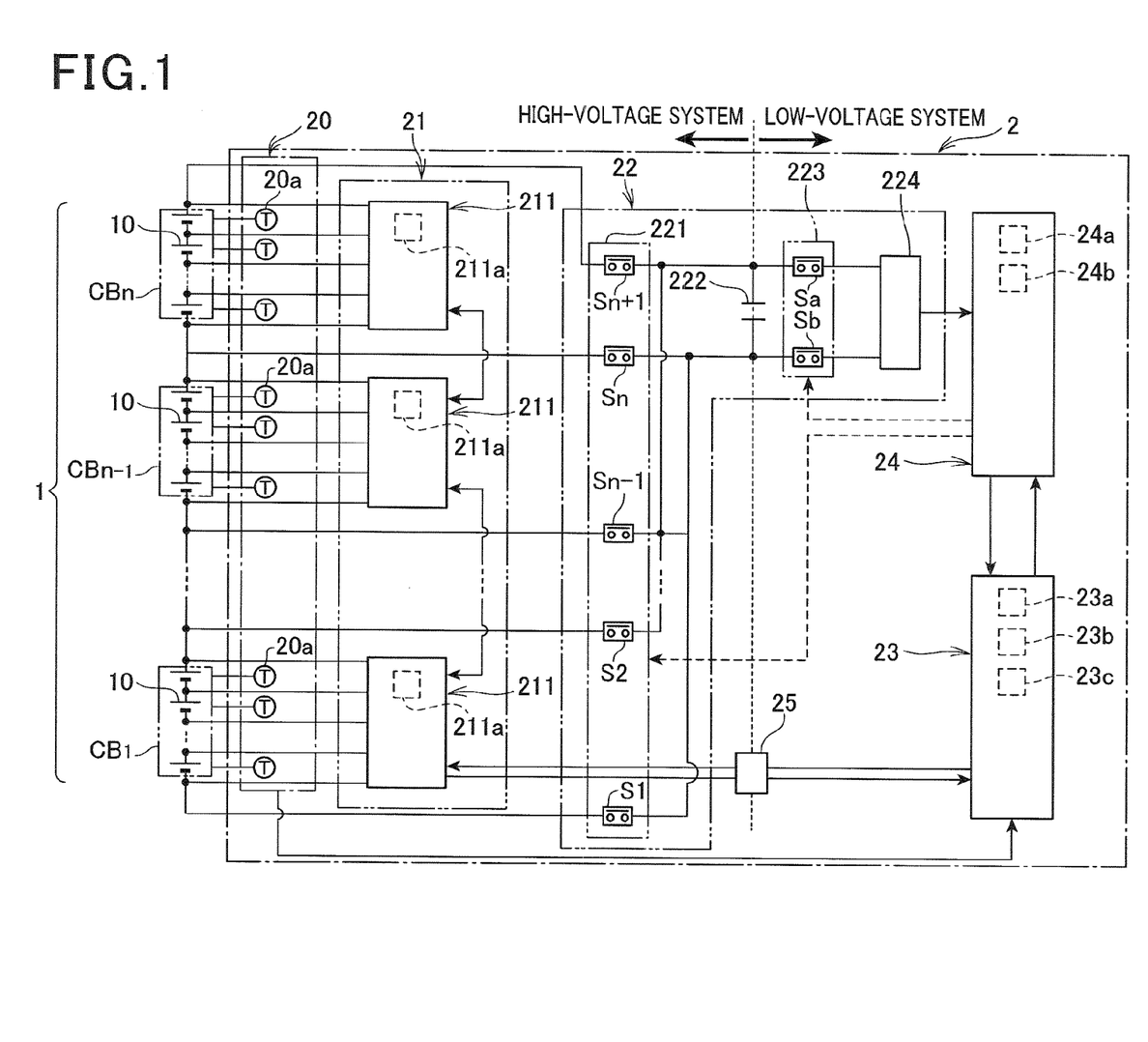
FIG. 1 is a block diagram showing a general configuration of a battery monitoring apparatus, according to an embodiment of the present invention.

In the present embodiment, as shown in FIG. 1, a battery monitoring apparatus 2 is applied to a battery pack 1 which is installed in a vehicle, such as a hybrid vehicle or an electric vehicle. The battery pack 1 and the battery monitoring apparatus 2 configure a battery system mounted in the vehicle.

The battery pack 1 configures an in-vehicle high-voltage battery that supplies electric power primarily to an electric motor for running the vehicle and to other various in-vehicle electrical loads. The battery pack 1 includes battery cells 10 each configured by a secondary cell, such as a lithium-ion battery. The battery cells 10 are electrically connected in series to provide a serial connection.

As shown in FIG. 1, in the battery back 1 of the present embodiment, the battery cells 10, each configuring the smallest unit subject to charge/discharge, are grouped into battery blocks CB1 to CBn each of which includes a predetermined number of battery cells 10 (e.g., four).

The battery pack 1 configured as described above is connected to the battery monitoring apparatus 2 via a plurality of detection lines or the like which are connected to the electrode terminals (positive terminal and negative terminal) of the respective battery cells 10.

The battery monitoring apparatus 2 includes a monitoring unit (including a main monitoring unit and a sub monitoring unit) and a control unit. The monitoring unit and the control unit may be referred to a monitor (including a main monitor and a sub monitor) or monitoring means (including main monitoring means and sub monitoring means) and a controller or control means, respectively.

The monitoring unit monitors a plurality of physical quantities indicating the state of the battery pack 1. In the present embodiment, battery temperature and battery voltage are used as the plurality of physical quantities. The control unit detects malfunction of the battery pack 1 on the basis of the results of the monitoring performed by the monitoring unit. Specifically, the battery monitoring apparatus 2 of the present embodiment mainly includes a temperature sensing circuit 20, a main monitoring circuit 21 and a sub monitoring circuit 22, which configure the monitoring unit, and includes a main microcomputer (main control unit) 23 and a sub microcomputer (sub control unit) 24, which configure the control unit.

The temperature sensing circuit 20 senses a battery temperature among the plurality of physical quantities indicating the state of the battery pack 1. The temperature sensing circuit 20 configures the main monitoring unit, together with the main monitoring circuit 21. The temperature sensing circuit 20 of the present embodiment is configured by a plurality of temperature sensors 20a which are disposed to the respective battery cells 10. The temperature sensing circuit 20 is connected to the main microcomputer 23, which will be described later, to output the results of the sensing of each temperature sensor 20a to the main microcomputer 23, as the results of the monitoring for the temperature of the battery pack 1.

The main monitoring circuit 21 detects a battery voltage that is a part of the physical quantities among the plurality of physical quantities indicating the state of the battery pack 1. The main monitoring circuit 21 configures the main monitoring unit, together with the temperature sensing circuit 20. The main monitoring circuit 21 of the present embodiment is configured to individually monitor the voltages of the respective battery cells 10.

The main monitoring circuit 21 of the present embodiment is configured by a plurality of monitoring ICs (integrated circuits) (a plurality of monitoring sections) 211 corresponding to the respective battery blocks CB1 to CBn. For example, the monitoring ICs 211, which are integrated circuits, detect the states of the battery cells 10 of the respective battery blocks CB1 to CBn, in response to a control signal from the main microcomputer 23. The monitoring ICs 211 are configured to be activated when being supplied with electric power from the respective battery blocks CB1 to CBn.

The monitoring ICs 211 of the present embodiment are daisy-chain connected so as to enable signal transmission between adjacent monitoring ICs 211. One of the monitoring ICs 211 (the monitoring IC 211 on the lowest potential side in FIG. 1) is connected to the main microcomputer 23 via an insulation section 25, such as a photocoupler. The insulation section 25 is an insulating means that ensures insulation between the battery pack 1 side (high-voltage system) and the main microcomputer 23 side (low-voltage system).

The signals indicating the results of the monitoring performed by the monitoring ICs 211 are inputted to the main microcomputer 23 via the monitoring IC 211 connected to the main microcomputer 23. Also, the control signals outputted from the microcomputer 23 are sequentially transmitted to the monitoring ICs 211 via the monitoring IC 211 connected to the main microcomputer 23. Signal transmission between the monitoring ICs 211 and the microcomputer 23 does not necessarily have to be realized by the daisy-chain connection but may be realized by another connection in which each of the monitoring ICs 211 is connected to the main microcomputer 23.

Each monitoring IC 211 of the present embodiment is configured by a voltage detection circuit 211a that detects a voltage of the battery cells 10 of the corresponding battery block among the battery blocks CB1 to CBn. Specifically, each voltage detection circuit 211a is an analog to digital (AD) conversion type voltage detection circuit that samples a voltage of a battery cell 10 at a predetermined cycle, converts the sampled voltage to a digital signal and outputs the digital signal.

Each cell voltage detection circuit 211a includes a multiplexer, an operational amplifier and an analog to digital (AD) converter, which are not shown. The multiplexer is a switching means that selectively connects both of the terminals of any one of the battery cells 10 to a pair of input terminals of the operational amplifier. The operational amplifier is a differential amplifier circuit that outputs an analog signal in accordance with the potential difference across the terminals of the battery cell 10 that has been selected by the multiplexer. The analog signal outputted from the operational amplifier is converted to a digital signal by the AD converter.

Similar to the main monitoring circuit 21, the sub monitoring circuit 22 detects a battery voltage that is a part of the physical quantities among the plurality of physical quantities indicating the state of the battery pack 1. The sub monitoring circuit 22 configures the sub monitoring unit.

The sub monitoring circuit 22 is configured to collectively monitor two or more serially connected battery cells 10 as a unit, such that the sub monitoring circuit 22 is smaller in the number of monitored (detected) battery voltages of the battery pack 1 than the main monitoring circuit 21.

The sub monitoring circuit 22 serves as a block voltage detection circuit that collectively detects the voltage of the two or more serially connected battery cells 10 as a block voltage. Thus, the sub monitoring circuit 22 is configured to detect the voltage of the battery blocks CB1 to CBn in a block-by-block manner.

Specifically, the sub monitoring circuit 22 is configured by a flying-capacitor type voltage detection circuit that includes a capacitor 222 for storing the block voltage, a detection section 224 for detecting the block voltage stored in the capacitor 222, an input section 221 and an output section 223.

The input section 221 is a circuit that inputs/applies the block voltage of the battery blocks CB1 to CBn into/to the capacitor 222. The input section 221 includes input-side switching elements S1 to Sn+1 which are arranged on the detection lines that are connected to both ends of the respective battery blocks CB1 to CBn.

The output section 223 is a circuit that outputs/applies the block voltage stored in the capacitor 222 to the detection section 224. The output section 223 includes output-side switching elements Sa and Sb that are arranged on the lines connecting between the capacitor 222 and the detection section 224.

The sub monitoring circuit 22 is provided to enhance the reliability of the battery monitoring apparatus 2. Accordingly, the sub monitoring circuit 22 is not essential as far as the main monitoring circuit 21 normally functions. Therefore, the sub monitoring circuit 22 is configured to be lower in detection performance (e.g., detection accuracy or detection speed [corresponding to a detection time]) than the main monitoring circuit 21.

As mentioned above, the sub monitoring circuit 22 of the present embodiment is configured to detect the voltage of the battery blocks CB1 to CBn in a block-by-block manner. Accordingly, the detection accuracy of the sub monitoring circuit 22 per battery cell 10 is lower than that of the main monitoring circuit 21 which detects the voltage of the battery cells 10 in a cell-by-cell manner.

On the other hand, the sub monitoring circuit 22 is smaller than the main monitoring circuit 21 in the number of monitored battery voltages of the battery pack 1 and therefore the sub monitoring circuit 22 is configured to be lower in detection performance than the main monitoring circuit 21. Accordingly, the sub monitoring circuit 22 can be realized with a more simplified circuit configuration compared to the main monitoring circuit 21. The capacitor 222 functions as an insulating means that ensures insulation between the battery pack 1 side (high-voltage system) and the detection section 224 side (low-voltage system).

The main microcomputer 23 and the sub microcomputer 24 are each configured by a computer that includes a CPU and various memories that configure a storage unit, and peripheral devices of the microcomputer. Each of these main and sub microcomputers 23 and 24 is configured to execute various processes in accordance with the control programs stored in the memories.

The main and sub microcomputers 23 and 24 of the present embodiment are connected to each other to enable two-way communication, so that the main and sub microcomputers 23 and 24 can mutually monitor their existence states. The microcomputers 23 and 24 are driven by a power accumulating means (e.g., in-vehicle auxiliary battery) as a power source which is different from the battery pack 1.

The main microcomputer 23 configures a main control unit. The main microcomputer 23 controls the main monitoring circuit 21 and charge/discharge of the battery pack 1. In addition, the main microcomputer 23 detects malfunction of the battery pack 1 on the basis of the results of the monitoring performed by the temperature detection circuit 20 and the main monitoring circuit 21, which configure the main monitoring means.

Specifically, the main microcomputer 23 acquires a temperature of each of the battery cells 10 from the temperature detection circuit 20 as the results of the monitoring. At the same time, the main microcomputer 23 outputs a control signal to the main monitoring circuit 21 to instruct it monitoring of the voltage conditions, and acquires a voltage value of each of the battery cells 10, which has been detected by the main monitoring circuit 21, as the results of the monitoring.

Further, the main microcomputer 23 detects malfunction of the temperature of the battery pack 1 on the basis of the results of the monitoring acquired from the temperature sensing circuit 20. Also, the main microcomputer 23 detects malfunction of the voltage of the battery pack 1 on the basis of the results of the monitoring acquired from the main monitoring circuit 21.

In addition, the main microcomputer 23 performs a process for controlling the state of the battery pack 1 (e.g., switching control for switching between charge and discharge of the battery pack 1, temperature control, or the like) on the basis such as of the results of the monitoring acquired from the main monitoring circuit 21.

In the present embodiment, the configuration for controlling the main monitoring circuit 21 in the main microcomputer 23 configures a main controller 23a. Similarly, the configuration for detecting malfunction of the battery pack 1 configures a main malfunction detector 23b, and the configuration for controlling the state of the battery pack 1 configures a state controller 23c.

The sub microcomputer 24 configures a sub control unit, and controls the sub monitoring circuit 22 and detects malfunction of the battery pack 1 on the basis of the results of the monitoring performed by the sub monitoring circuit 22. Specifically, the sub microcomputer 24 controls the operations of the input section 221 and the output section 223 of the sub monitoring circuit 22 to acquire the voltage of each of the battery blocks CB1 to CBn, which has been detected by the sub monitoring circuit 22, as the results of the monitoring.

The sub microcomputer 24 performs a process of detecting malfunction of the voltage or the like of the battery pack 1 on the basis of the results of the monitoring acquired from the sub monitoring circuit 22. However, the sub microcomputer 24 does not perform the process of controlling the state of the battery pack 1, which is performed by the main microcomputer 23. In the present embodiment, a sub controller 24a is configured to control the sub monitoring circuit 22 in the sub microcomputer 24. Similarly, a sub malfunction detector 24b is configured to detect malfunction of the battery pack 1.

The sub microcomputer 24 of the present embodiment acquires a smaller amount of data compared to the main microcomputer 23 that acquires detailed data, such as the voltage and temperature of each of the battery cells 10. Since the sub microcomputer 24 of the present embodiment does not perform state control for the battery pack 1, which is performed by the main microcomputer 23, the number of processes to be controlled by the sub microcomputer 24 is smaller than that of the main microcomputer 23. Accordingly, in the present embodiment, the sub microcomputer 24 is configured to be lower in processing ability (e.g., clock rate) and memory capacity than the main microcomputer 23.

Figure 2:
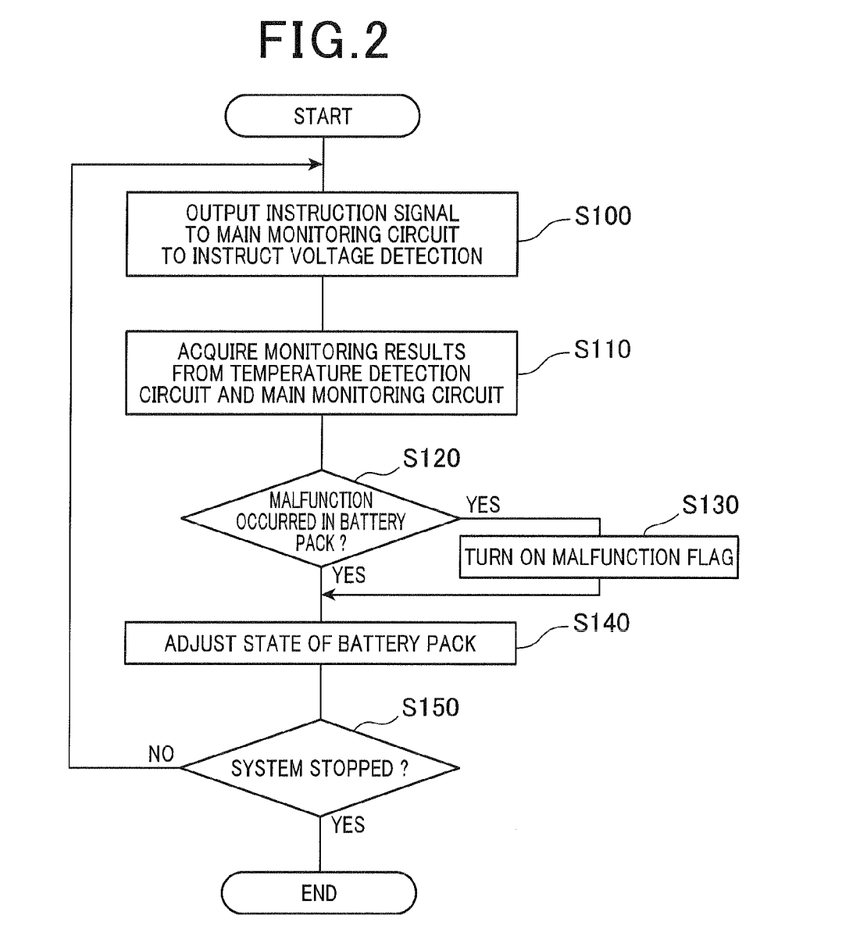
FIG. 2 is a flow chart showing a flow of control performed by a main microcomputer, according to the embodiment.
Figure 3:
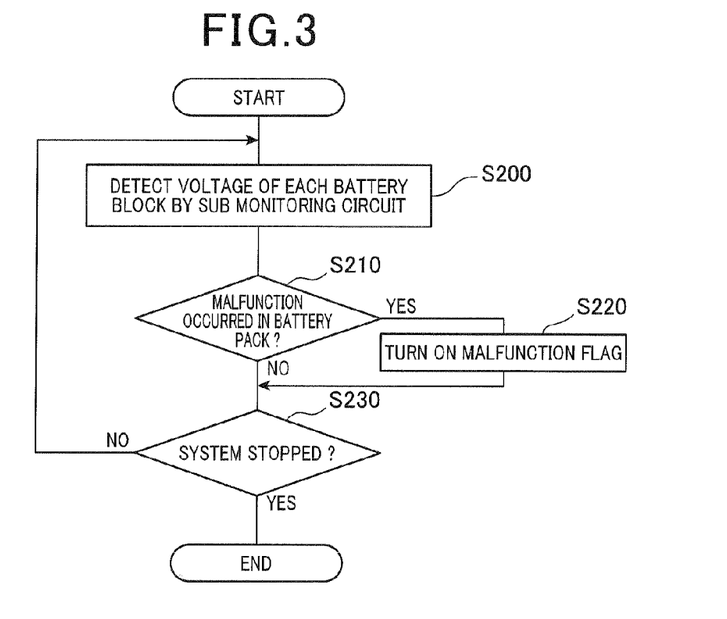
FIG. 3 is a flow chart illustrating a flow of control performed by a sub microcomputer, according to the embodiment.

Referring now to FIGS. 2 and 3, hereinafter is described a malfunction detection process performed for the battery pack 1 by each of the main and sub microcomputers 23 and 24. The flows illustrated in FIGS. 2 and 3 are started based on the startup of the vehicle system or a command or the like received from a higher-order control unit.

First, hereinafter is described an example of the malfunction detection process for the battery pack 1 performed by the main microcomputer 23. As shown in FIG. 2, the main microcomputer 23 outputs a control signal to each of the monitoring ICs 211 of the main monitoring circuit 21 to thereby instruct detection of the voltage of the battery cells 10 (step S100). Thus, the cell voltage detection circuit 211a of each monitoring IC 211 detects the voltage of each of the battery cells 10 that configure the corresponding battery block among the battery blocks CB1 to CBn.

Subsequently, the main microcomputer 23 acquires the temperature of each of the battery cells 10, i.e. the results of the monitoring, from the temperature detection circuit 20, and the voltage of each of the battery cells 10, i.e. the results of the monitoring, from the monitoring ICs 211 (step S110). Then, the main microcomputer 23 determines whether or not malfunction has occurred in the battery pack 1 on the basis of the results of the monitoring acquired from the temperature detection circuit 20 and the monitoring ICs 211 (step S120).

In the determination processing at step S120, the main microcomputer 23 determines whether or not the temperature of each of the battery cells 10 acquired from the temperature detection circuit 20 is within a predetermined allowable temperature range. If an acquired temperature is out of the allowable temperature range, the main microcomputer 23 determines that the temperature of the battery cell 10 is excessively low or excessively high and then determines that malfunction has occurred in the battery pack 1.

The allowable temperature range is set to a range in which each of the battery cells 10 can exert its requested output performance and which is within a range of heat resistance of the battery cells 10. The allowable temperature range is stored in advance in the memory of the main microcomputer 23.

In the determination processing at step S120, the main microcomputer 23 determines whether or not the voltage of each of the battery cells 10 acquired from the monitoring ICs 211 is within a predetermined allowable cell voltage range. If a voltage is out of the allowable cell voltage range, the main microcomputer 23 determines that the battery cell 10 is overcharged or overdischarged and then determines that malfunction has occurred in the battery pack 1.

The allowable cell voltage range is set to a range in which each of the battery cells 10 can exert its requested output performance and which is within a range of withstand voltage of the battery cells 10. The allowable cell voltage range is stored in advance in a memory of the main microcomputer 23.

As a result of the determination processing at step S120, if it is determined that malfunction has occurred in the battery pack 1, the main microcomputer 23 turns on an malfunction flag for indicating presence/absence of malfunction of the battery pack 1 (step S130). The malfunction flag is referred to by a higher-order control unit than the main microcomputer 23. At the initial setting, the malfunction flag is set to an "off state" indicating that the battery pack 1 is in a normal state.

If the battery pack 1 is determined to be in a normal state in the determination processing at step S120, or after the malfunction flag has been turned on at step S130, a state control process is performed for the battery pack 1 (step S140). In the state control process, the main microcomputer 23 switches the state of the battery pack 1 between charge and discharge by allowing the battery pack 1 to supply power to various electrical loads (discharge), or allowing the battery pack 1 to be supplied with power from outside (charge).

Subsequently, the main microcomputer 23 determines whether or not stop conditions of the vehicle system have been met (step S150). If the system is determined to have been stopped, the malfunction detection process is halted. If the system is determined not to have been stopped, control returns to step S100.

Hereinafter is described an example of an malfunction detection process for the battery pack 1 performed by the sub microcomputer 24. As shown in FIG. 3, the sub microcomputer 24 controls the operations of the input section 221 and the output section 223 of the sub monitoring circuit 22 to acquire a block voltage of each of the battery blocks CB1 to CBn as the results of the monitoring (step S200).

Subsequently, the sub microcomputer 24 determines whether or not malfunction has occurred in the battery pack 1 on the basis of the results of the monitoring acquired from the sub monitoring circuit 22 (step S210). In the determination processing at step S210, the sub microcomputer 24 determines whether or not the block voltage of each of the battery blocks CB1 to CBn acquired from the sub monitoring circuit 22 is within an allowable block voltage range. If the block voltage is out of the allowable block voltage range, the sub microcomputer 24 determines that malfunction has occurred in the battery pack 1.

The allowable block voltage range is set to a range in which each of the battery blocks CB1 to CBn can exert its requested output performance and which is within a range of withstand voltage of the battery blocks CB1 to CBn. The allowable block voltage range is stored in advance in a memory of the sub microcomputer 24.

As a result of the determination processing at step S210, if malfunction is determined to have occurred in the battery pack 1, the sub microcomputer 24 turns on an malfunction flag for indicating presence/absence of malfunction of the battery pack 1 (step S220). Since the malfunction flag is similar to that on the main microcomputer 23 side, description is omitted.

If the battery pack 1 is determined to be in a normal state in the determination processing at step S210, or after the malfunction flag has been turned on at step S220, the sub microcomputer 24 determines whether or not stop conditions of the vehicle system have been met (step S230). If the system is determined to have been stopped, the malfunction detection process is halted. If the system is determined not to have been stopped, control returns to step S200.

The battery monitoring apparatus 2 of the embodiment described above is configured such that both of the main monitoring circuit 21 configuring the main monitoring unit and the sub monitoring circuit 22 configuring the sub monitoring unit are ensured to monitor the battery voltage that indicates the state of the battery pack 1. Thus, in the event that one of the monitoring circuits has any fault, the voltage of the battery pack 1 can be continuously monitored by the other one of the monitoring circuits.

Of the plurality of physical quantities (battery temperature and battery voltage) monitored by the main monitoring unit composed of the temperature detection circuit 20 and the main monitoring circuit 21, a part of the physical quantities (battery voltage) is ensured to be monitored by the sub monitoring unit composed of the sub monitoring circuit 22. Accordingly, compared to the case where the sub monitoring unit and the main monitoring unit are similarly configured, the battery monitoring apparatus 2 can be realized with a simplified configuration.

Accordingly, the battery monitoring apparatus 2 of the present embodiment can enhance reliability, while being prevented from having a more complicated internal configuration, which would be attributed to the redundancy of the means for monitoring the state of the battery pack 1.

In particular, in the present embodiment, the sub monitoring circuit 22 is ensured to be smaller in the number of monitored (detected) battery voltages within the part of the physical quantities than the main monitoring circuit 21. Thus, the circuit configuration of the sub monitoring circuit 22 can be simplified, leading to realizing the battery monitoring apparatus 2 with a more simplified configuration. Resultantly, the cost of the battery monitoring apparatus 2 is reduced.

In the present embodiment, the sub monitoring circuit 22 is configured by a voltage detection circuit which is lower in detection performance of detecting the voltage of the battery pack 1 than the main monitoring circuit 21. Accordingly, the sub monitoring circuit 22 can be realized with a simplified configuration compared to the main monitoring circuit 21. Thus, the battery monitoring apparatus 2 is well prevented from having complication in the internal configuration, which would be attributed to the redundancy of the means for monitoring the state of the battery pack 1. Resultantly, the cost of the battery monitoring apparatus 2 is reduced.

Further, in the present embodiment, the main microcomputer 23 is ensured to detect malfunction of the voltage of the battery pack 1 on the basis of the results of the monitoring performed by the main monitoring circuit 21. At the same time, the sub microcomputer 24 is ensured to detect malfunction of the voltage of the battery pack 1 on the basis of the results of the monitoring performed by the sub monitoring circuit 22.

Thus, by giving redundancy to the configuration for detecting malfunction of the voltage of the battery pack 1, in the event that one of the main and sub microcomputers 23 and 24 has any fault, the other one of the microcomputers can detect malfunction of the voltage of the battery pack 1.

In this regard, the processing related to the state control of the battery pack 1 is ensured to be performed by the main microcomputer 23 but not by the sub microcomputer 24. Accordingly, the sub microcomputer 24 can be configured by a microcomputer which is lower in processing ability than main microcomputer 23, memory capacity and the like. Thus, the sub microcomputer 24 can be realized with a more simplified configuration than the main microcomputer 23.

Thus, according to the present embodiment, the battery monitoring apparatus 2 is enhanced in the reliability, while being prevented from having complication in the internal configuration, which would be attributed to the redundancy in the configuration for detecting malfunction of the battery pack 1.

(Modifications)

An embodiment of the present invention has been described so far. However, the components of the embodiment are not necessarily essential unless, for example, the components are explicitly described to be particularly essential and the components are apparently considered to be essential in principle.

In the embodiment described above, when numerical values, such as the number of components, numerical values, amounts and ranges, are referred to, the numerical values are not limited to the specific values unless, for example, the numerical values are explicitly described to be particularly essential and the numerical values are apparently limited to the specific values in principle.

The present invention is not limited to the embodiment described above but may be modified as appropriate within a scope not departing from the spirit of the present invention. For example, the present invention may be variously modified as follows.

(1) In the embodiment described above, the voltage of each of the battery cells 10 is monitored by the main monitoring circuit 21, and the voltage of each of the blocks CB1 to CBn is monitored by the sub monitoring circuit 22. However, configuration is not limited to this. The main monitoring circuit 21 may collectively monitor the voltage of two or more battery cells 10, if the sub monitoring circuit 22 is smaller than the main monitoring circuit 21 in the number of monitored battery voltages of the battery pack 1.

From the standpoint of simplifying the internal configuration of the battery monitoring apparatus 2, it is desirable that the sub monitoring circuit 22 is ensured to be smaller than the main monitoring circuit 21 in the number of monitored battery voltages of the battery pack 1. However, not being limited to this, the number of detections of the battery voltage of the battery pack 1 may be the same between the main and sub monitoring circuits 21 and 22.

(2) In the embodiment described above, the means for monitoring battery voltage that is one of the plurality of physical quantities indicating the state of the battery pack 1, is redundantly configured by the main and sub monitoring circuits 21 and 22, while the means for monitoring battery temperature (temperature detection circuit 20) is not redundantly configured. However, configuration is not limited to this.

For example, the sub monitoring circuit 22 may be removed and, instead, other temperature detection circuit (hereinafter referred to as "second temperature detection circuit") for monitoring temperature of the battery pack 1 may be provided separately from the temperature detection circuit 20. In this case, a redundant configuration is given to only the means for monitoring battery temperature that is one of the plurality of physical quantities indicating the state of the battery pack 1.

Also, in this case, the main monitoring unit is configured by the main monitoring circuit 21 and the temperature detection circuit 20 that is larger in the number of monitored temperatures of the battery pack 1 than the second temperature detection circuit. The sub monitoring unit is configured by the second temperature detection circuit that is smaller in the number of monitored temperatures of the battery pack 1 than the temperature detection circuit 20. It is desirable that one of the redundant means for monitoring temperature of the battery pack 1 is smaller in the number of monitored (detected) temperatures of the battery pack 1 than that of the other one of the redundant means.

With this configuration, in the event that one of the temperature detection circuits has any fault, the other one of the temperature detection circuits can continuously monitor the temperature of the battery pack 1. Also, of the plurality of physical quantities (battery temperature and battery voltage) monitored by the temperature detection circuit 20 and the main monitoring circuit 21 configuring the main monitoring unit, a part of the physical quantities (battery temperature) is ensured to be monitored by the temperature detection circuit configuring the sub monitoring unit.

Accordingly, compared to the case where the sub and main monitoring unit are similarly configured, the battery monitoring apparatus 2 can be realized with a simplified configuration. Thus, the battery monitoring apparatus 2 will be enhanced in reliability, while being prevented from having complication in the internal configuration, which would be attributed to the redundancy of the means for monitoring the state of the battery pack 1.

Alternatively, means for monitoring the current passing through the battery pack 1 may have a redundant configuration, the current being one of the plurality of physical quantities indicating the state of the battery pack 1, and means for monitoring other physical quantities may be ensured not have a redundant configuration.

(3) In the embodiment described above, the temperature sensors 20*a* are disposed to the respective battery cells 10. However, configuration is not limited to this. For example, the temperature sensor 20*a* may be disposed to every predetermined number of battery cells 10.

(4) As described in the above embodiment, from the standpoint of enhancing reliability of the battery monitoring apparatus 2, it is desirable that the control unit for detecting malfunction of the battery pack 1 is redundantly configured by the main and sub microcomputers 23 and 24. However, configuration is not limited to this. The main and sub microcomputers 23 and 24 may be integrally configured by a single microcomputer. This configuration can contribute to simplifying the internal configuration of the battery monitoring apparatus 2.

(5) As described in the above embodiment, from the standpoint of simplifying the internal configuration of the battery monitoring apparatus 2, it is desirable that the sub monitoring circuit 22 is lower than the main monitoring circuit 21 in the performance of detecting physical quantities that indicate the state of the battery pack 1. However, configuration is not limited to this. The main and sub monitoring circuits 21 and 22 may have the same level of detection performance.

(6) In the embodiment described above, each voltage detection circuit 211*a* of the main monitoring circuit 21 is configured by an AD conversion type voltage detection circuit, and the sub monitoring circuit 22 is configured by a flying-capacitor type voltage detection circuit. However, configuration is not limited to this.

The main and sub monitoring circuits 21 and 22 may each be configured by circuits of different types. The circuits of different types may include, for example, a resistance-voltage-dividing type voltage detection circuit that uses a resistance voltage divider circuit, or a threshold-determination type detection circuit that detects overcharge or overdischarge of the battery pack 1 by comparing a reference voltage as a threshold with a cell voltage or a block voltage.

(7) As described in the above embodiment, from the standpoint of simplifying the internal configuration of the battery monitoring apparatus 2, it is desirable that the sub microcomputer 24 is configured to be lower than the main microcomputer 23 in the processing ability or the like. However, the configuration is not limited to this. Both of the main and sub microcomputers 23 and 24 may have the same level of processing ability.

(8) As described in the above embodiment, from the standpoint of simplifying the internal configuration of the battery monitoring apparatus 2, it is desirable that the main microcomputer 23 is ensured to perform the processing related to state control of the battery pack 1 and the sub microcomputer 24 is ensured not to perform this processing. However, configuration is not limited to this. Both of the sub and main microcomputers 23 and 24 may perform the processing related to state control of the battery pack 1.

(9) In the embodiment described above, the sub monitoring circuit 22 detects voltage of each of the battery blocks CB1 to CBn corresponding to the respective monitoring ICs 211. However, the configuration is not limited to this. The sub monitoring circuit 22 only has to serve as a voltage detection circuit that detects voltage of two or more serially connected battery cells 10 as a unit, without being limited to the block-by-block basis detection of the battery blocks CB1 to CBn. For example, the sub monitoring circuit 22 may detect a total voltage of all of the battery cells 10 that configure the battery pack 1.

(10) In the embodiment described above, the main monitoring circuit 21 is configured by a plurality of monitoring ICs 211. However, the configuration is not limited to this. For example, the main monitoring circuit 21 may be configured by a single integrated circuit.

(11) In the embodiment described above, the sub monitoring circuit 22 is configured by a flying-capacitor type voltage detection circuit that detects a block voltage using a single capacitor 222. However, the configuration is not limited to this. For example, the sub monitoring circuit 22 may be configured by a flying-capacitor type voltage detection circuit that detects a block voltage using two or more capacitors 222.

(12) In the embodiment described above, the malfunction flag is turned on when the sub and main microcomputers 23 and 24 detect malfunction of the battery pack 1. However, configuration is not limited to this. For example, when the sub and main microcomputers 23 and 24 detect malfunction of the battery pack 1, a higher-order device may be ensured to be informed accordingly.

(13) In the embodiment described above, the battery monitoring apparatus 2 of the present invention is applied to the battery pack 1 installed in a vehicle. However, the battery monitoring apparatus 2 may be applied to the battery pack 1 which is used for systems other than vehicles.

What is claimed is:

1. A battery monitoring apparatus for monitoring a battery state of a battery pack configured by a plurality of battery cells, comprising:
   a main monitoring unit configured to monitor a plurality of physical quantities indicating the battery state of the battery pack;
   a sub monitoring unit configured to monitor a part of the physical quantities separately from the main monitoring unit; and
   a control unit configured to detect malfunction of the battery pack on the basis of at least one of a monitoring result of the main monitoring unit and a monitoring result of the sub monitoring unit,
   wherein:
   the control unit includes:
      a main control unit that detects malfunction of the battery pack on the basis of the monitoring result of the main monitoring unit, and
      a sub control unit that detects malfunction of the battery pack on the basis of the monitoring result of the sub monitoring unit;
   at least one of the main control unit and the sub monitoring unit includes a state controller configured to control the battery state;
   the main monitoring unit is configured to monitor the part of the physical quantities for all of the plurality of battery cells; and
   the sub monitoring unit is configured to monitor the part of the physical quantities for two or more battery cells.

2. The battery monitoring apparatus according to claim 1, wherein the sub monitoring unit is configured to be smaller in the number of the physical quantities monitored as the part of the physical quantities than the main monitoring unit.

3. The battery monitoring apparatus according to claim 2, wherein:

the sub monitoring unit is configured to be lower in detection performance of the part of the physical quantities than the main monitoring unit.

4. The battery monitoring apparatus according to claim 1, wherein the part of the physical quantities includes a battery voltage of the battery pack;

the main monitoring unit includes a cell voltage detection circuit that individually detects a cell voltage of each of the battery cells; and the sub monitoring unit includes a block voltage detection circuit that collectively detects, as a block voltage, a cell voltage of two or more serially connected battery cells forming a battery block.

5. The battery monitoring apparatus according to claim 1, wherein:

the sub monitoring unit is lower in detection performance of the part of the physical quantities than the main monitoring unit.

6. The battery monitoring apparatus according to claim 1, wherein the plurality of physical quantities include a battery voltage of the battery pack;

the part of the physical quantities includes a battery voltage of the battery pack;

the main monitoring unit includes a cell voltage detection circuit that individually detects a cell voltage of each of the battery cells; and the sub monitoring unit includes a block voltage detection circuit that collectively detects, as a block voltage, a cell voltage of two or more serially connected battery cells forming a battery block.

7. The battery monitoring apparatus according to claim 6, wherein the plurality of physical quantities further include a battery temperature of the battery pack; and the main monitoring unit further includes a temperature detection circuit that separately detects a temperature of each of the battery cells.

8. The battery monitoring apparatus according to claim 1, wherein the battery pack is installed in a vehicle.

9. A battery system, comprising:

a battery pack configured by a plurality of battery cells; and a battery monitoring apparatus that monitors a battery state of the battery pack, the battery monitoring apparatus including:

a main monitoring unit configured to monitor a plurality of physical quantities indicating the battery state of the battery pack;

a sub monitoring unit configured to monitor a part of the physical quantities separately from the main monitoring unit; and a control unit configured to detect malfunction of the battery pack on the basis of at least one of a monitoring result of the main monitoring unit and a monitoring result of the sub monitoring unit, wherein:

the control unit includes:

a main control unit that detects malfunction of the battery pack on the basis of the monitoring result of the main monitoring unit, and a sub control unit that detects malfunction of the battery pack on the basis of the monitoring result of the sub monitoring unit;

at least one of the main control unit and the sub monitoring unit includes a state controller configured to control the battery state;

the main monitoring unit is configured to monitor the part of the physical quantities for all of the plurality of battery cells; and the sub monitoring unit is configured to monitor the part of the physical quantities for two or more battery cells.

10. A battery monitoring method for monitoring a battery state of battery pack configured by a plurality of battery cells, comprising:

monitoring, by a main monitoring unit, a plurality of physical quantities indicating the battery state of the battery pack;

monitoring, by a sub monitoring unit, a part of the physical quantities separately from the main monitoring unit; and detecting, by a control unit, malfunction of the battery pack on the basis of at least one of a monitoring result of the main monitoring unit and a monitoring result of the sub monitoring unit, wherein:

the control unit includes:

a main control unit that detects malfunction of the battery pack on the basis of the monitoring result of the main monitoring unit, and a sub control unit that detects malfunction of the battery pack on the basis of the monitoring result of the sub monitoring unit;

at least one of the main control unit and the sub monitoring unit includes a state controller configured to control the battery state;

the monitoring step using the main monitoring unit is configured to monitor the part of the physical quantities for all of the plurality of battery cells; and the monitoring step using the sub monitoring unit is configured to monitor the part of the physical quantities for two or more battery cells.

* * * * *